United States Patent
Lee et al.

(10) Patent No.: US 11,170,994 B1
(45) Date of Patent: Nov. 9, 2021

(54) CD DEPENDENT GAP FILL AND CONFORMAL FILMS

(71) Applicant: Applied Materials, Inc., Santa Clara, CA (US)

(72) Inventors: Jung Chan Lee, Sunnyvale, CA (US); Praket P. Jha, San Jose, CA (US); Jingmei Liang, San Jose, CA (US); Jinrui Guo, Santa Clara, CA (US); Wenhui Li, Jilin (CN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/147,454

(22) Filed: Jan. 12, 2021

(51) Int. Cl.
 *H01L 21/02* (2006.01)
 *H01L 21/311* (2006.01)
(52) U.S. Cl.
 CPC .... *H01L 21/02274* (2013.01); *H01L 21/0217* (2013.01); *H01L 21/02164* (2013.01); *H01L 21/31116* (2013.01)

(58) Field of Classification Search
 None
 See application file for complete search history.

(56) References Cited

U.S. PATENT DOCUMENTS

| | | | |
|---|---|---|---|
| 4,656,300 A * | 4/1987 | Lebrun | C04B 35/571 423/324 |
| 2011/0034039 A1 | 2/2011 | Liang et al. | |
| 2019/0057897 A1 | 2/2019 | Kweskin | |
| 2019/0164811 A1 | 5/2019 | Kweskin et al. | |
| 2019/0221424 A1 * | 7/2019 | Lee | H01L 21/02211 |
| 2020/0258774 A1 | 8/2020 | Kweskin | |

* cited by examiner

*Primary Examiner* — Roberts P Culbert
(74) *Attorney, Agent, or Firm* — Servilla Whitney LLC

(57) ABSTRACT

A method of depositing a silicon-containing material is disclosed. Some embodiments of the disclosure provide films which fill narrow CD features without a seam or void. Some embodiments of the disclosure provide films which form conformally on features with wider CD. Embodiments of the disclosure also provide superior quality films with low roughness, low defects and advantageously low deposition rates.

20 Claims, 5 Drawing Sheets

CD DEPENDENT GAP FILL AND CONFORMAL FILMS

TECHNICAL FIELD

Embodiments of the disclosure generally relate to methods for forming gap fill and conformal films. In particular, embodiment of disclosure relate to methods which enable gap fill and conformal films which depend on the critical dimension (CD) of a substrate feature.

BACKGROUND

Next generation of SiGe finFETs and gate all around (GAA) transistors require films of superior quality that can be deposited at lower deposition temperatures. The relatively low deposition temperatures prevent or minimize SiGe out-diffusion.

Atomic Layer Deposition (ALD) processes and conventional "flowable" CVD have been evaluated at low deposition temperatures for shallow trench isolation (STI) gap fill. However, ALD frequently provides films with poor quality including seams or voids at narrow trench dimensions while conventional "flowable" CVD with low anneal temperatures provides films with high wet etch rate at wide trench dimensions due to film stress and high volumetric shrinkage.

Accordingly, there is a need for deposition methods which provide gap fill without seams or voids at narrower dimensions and high quality conformal films at wider dimensions.

SUMMARY

One or more embodiments of the disclosure are directed to a method for depositing a silicon-containing material. The method comprises exposing a substrate surface with at least one feature formed therein to a silicon precursor and a plasma based reactant to deposit a flowable polysilazane material. The flowable polysilazane material is exposed to UV radiation to cure the flowable polysilazane material and form a SiNH film. The SiNH film is annealed in an anneal environment to form a silicon-containing material.

Additional embodiments of the disclosure are directed to a method of forming a silicon oxide material. The method comprises exposing a substrate surface with at least one feature formed therein to trisilylamine and a plasma based reactant comprising water and/or oxygen to deposit a flowable polysilazane material. The flowable polysilazane material is exposed to UV radiation to cure the flowable polysilazane material and form a SiNH film. The substrate surface is exposed to oxygen or ozone before or during exposure to UV radiation. The SiNH film is annealed in an anneal environment comprising water to form a silicon oxide material. The silicon oxide material laterally fills the at least one feature without substantial seam or void when the opening width of the at least one feature is less than or equal to 10 nm, and the silicon oxide material forms conformally on the surface of the at least one feature when the opening width of the at least one feature is in a range of 20 nm to 40 nm.

Further embodiments of the disclosure are directed to a method of forming a silicon oxide material. The method comprises exposing a substrate surface with at least one feature formed therein to trisilylamine and a plasma based reactant comprising ammonia to deposit a flowable polysilazane material. The flowable polysilazane material is exposed to UV radiation to cure the flowable polysilazane material and form a SiNH film. The substrate surface is exposed to ammonia before or during exposure to UV radiation. The SiNH film is annealed in a dry anneal environment to form a silicon nitride material. The silicon nitride material laterally fills the at least one feature without substantial seam or void when the opening width of the at least one feature is less than or equal to 10 nm, and the silicon nitride material forms conformally on the surface of the at least one feature when the opening width of the at least one feature is in a range of 20 nm to 40 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
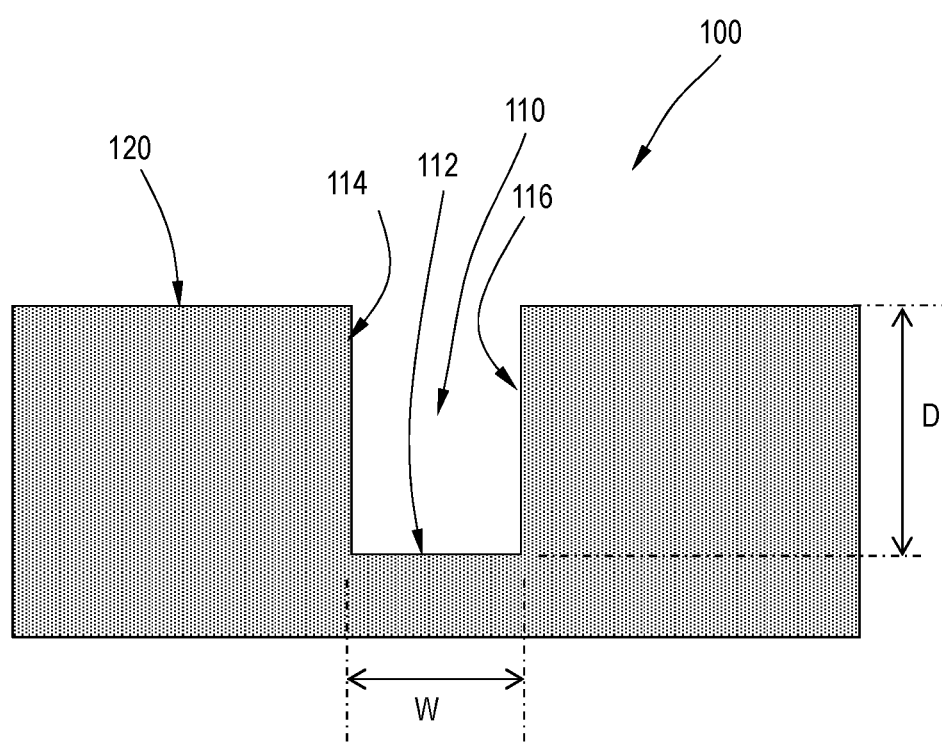
FIG. 1 illustrates an exemplary substrate with a feature prior to processing according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to methods for depositing a silicon-containing material. In some embodiments, the methods advantageously deposit flowable films at narrow CD and conformal films at middle or wide CD. In some embodiments, the methods advantageously provide seam/void free gap fill for narrow features (e.g., trenches).

In some embodiments, the methods advantageously provide superior film quality for films deposited on wider features. Without being bound by theory, the superior film quality is believed to result from reduced film stress as a result of the conformal deposition, reduced impurities and/or less volumetric shrinkage due to the reactive cure and/or the plasma post-treatment.

In some embodiments, the methods advantageously provide better integration with subsequent ALD of silicon based barrier films (e.g., SiC, SiCO, SiCN, SiCON, SiN and/or Si). In some embodiments, the methods advantageously provide silicon-containing films with reduced roughness and/or defects. In some embodiments, the methods enable cyclic dep/etch and/or dep/cure processes, Referring to the figures, the method 400 begins at operation 410 by exposing a substrate 100 with at least one feature 110 formed therein to a silicon precursor and a plasma based reactant to deposit a flowable polysilazane material 210. As used in this regard, a flowable material is one which, under the proper conditions will flow by gravity to the low point of a substrate surface and/or by capillary action to narrow CD spaces of trenches or other features. In some embodiments, the flowable polysilazane material has a relatively high viscosity and flows slowly. In some embodiments, the flowable polysilazane material has a lower viscosity and flows more readily.

In some embodiments, the silicon precursor comprises a compound which can be polymerized by the plasma based reactant to form a short oligomer. In some embodiments, the silicon precursor comprises or consists essentially of trisilylamine (TSA).

In some embodiments, the plasma based reactant is ignited in a region separate from the main processing region. Stated differently, in some embodiments, the plasma based reactant is a remote plasma or is ignited remotely. In some embodiments, the plasma based reactant comprises a plasma reactant and an inert gas. In some embodiments, the plasma reactant comprises or consists essentially of one or more of ammonia ($NH_3$), oxygen ($O_2$) or water ($H_2O$). In some embodiments, the inert gas comprises or consists essentially of a noble gas (e.g., helium, neon, argon, xenon).

FIG. 1 shows a cross-sectional view of a substrate 100 with a feature 110. The disclosure relates to substrates and substrate surfaces which comprise at least one feature. FIG. 1 shows a substrate 100 having a single feature 110 for illustrative purposes; however, those skilled in the art will understand that there can be more than one feature 110. The shape of the feature 110 can be any suitable shape including, but not limited to, trenches, cylindrical vias, or rectangular vias.

As used in this regard, the term "feature" means any intentional surface irregularity. Suitable examples of features include, but are not limited to trenches which have a top, two sidewalls and a bottom, and peaks which have a top and two sidewalls without a separate bottom surface. Features can have any suitable aspect ratio (ratio of the depth of the feature to the width of the feature) as discussed below.

The substrate 100 has a substrate surface 120. The at least one feature 110 forms an opening in the substrate surface 120. The feature 110 extends from the substrate surface 120 (also referred to as the top surface) to a depth D to a bottom surface 112. The feature 110 has a first sidewall 114 and a second sidewall 116. While the feature shown in FIG. 1 has parallel sidewalls 114, 116, the width of the feature is most often defined by the width W of the feature at the top opening of the feature 110; this measurement may also be referred to as the opening width. The open area formed by the sidewalls 114, 116 and bottom surface 112 are also referred to as a gap.

Figure 2:
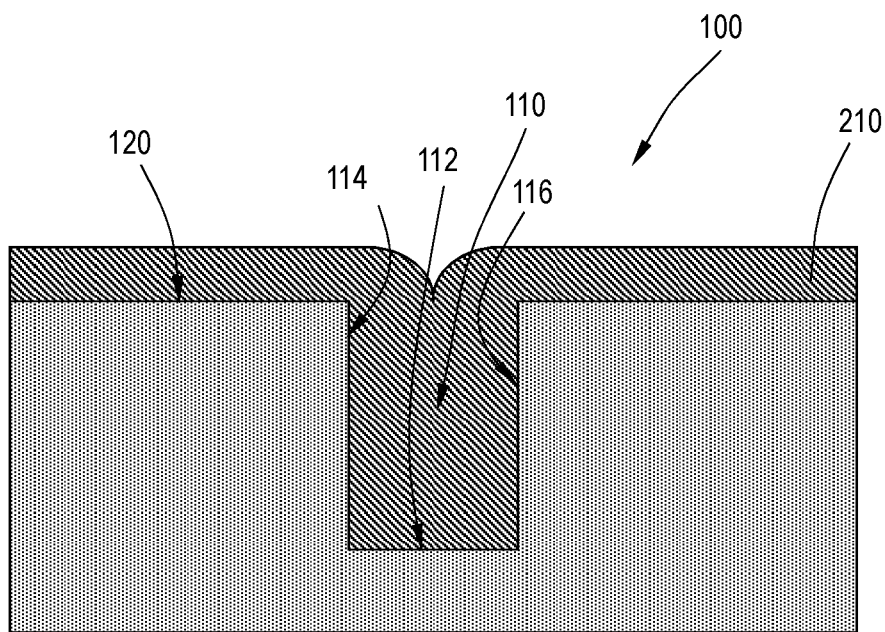
FIG. 2 illustrates an exemplary substrate with a narrow CD after processing according to one or more embodiment of the disclosure.

Referring to FIG. 2, in some embodiments, the at least one feature has a narrow opening width (less than or equal to 10 nm) and the flowable polysilazane material 210 laterally fills the at least one feature 110 without substantial seam or void. In some embodiments, the at least one feature has a narrow opening width (less than or equal to 10 nm) and the silicon-containing material laterally fills the at least one feature 110 without substantial seam or void.

As used in this specification and the appended claims, a seam is a gap or fissure that forms in the feature between, but not necessarily in the middle of, the sidewalls of the feature 110. Without being bound by theory, a seam may be formed when the lattice structures of films which have grown from the sidewalls of the feature do not harmonize as they meet near the center of the feature.

As used in this specification and the appended claims, a void is a vacant area in which the gap fill material 210 has not deposited within the feature 110. Without being bound by theory, voids often form when material deposits faster near the top of a feature and pinches closed the opening of the feature before the gap fill material can completely fill the feature. The remaining unfilled space is a void.

As used in this regard, the term "substantially free of seams" or "substantially free of voids" means that any crystalline irregularity or enclosed space without material formed in the space between the sidewalls of a feature is less than about 1% of the cross-sectional area of the feature.

Without being bound by theory, it is believed that the relatively narrow opening width promotes the flow of the flowable polysilazane material into the feature by capillary action. As the flowable material has no fixed crystalline structure it is less likely to form seams or voids within the feature. Accordingly, the silicon-containing material formed from the flowable polysilazane material is also less likely to have seams or voids present.

Figure 3:
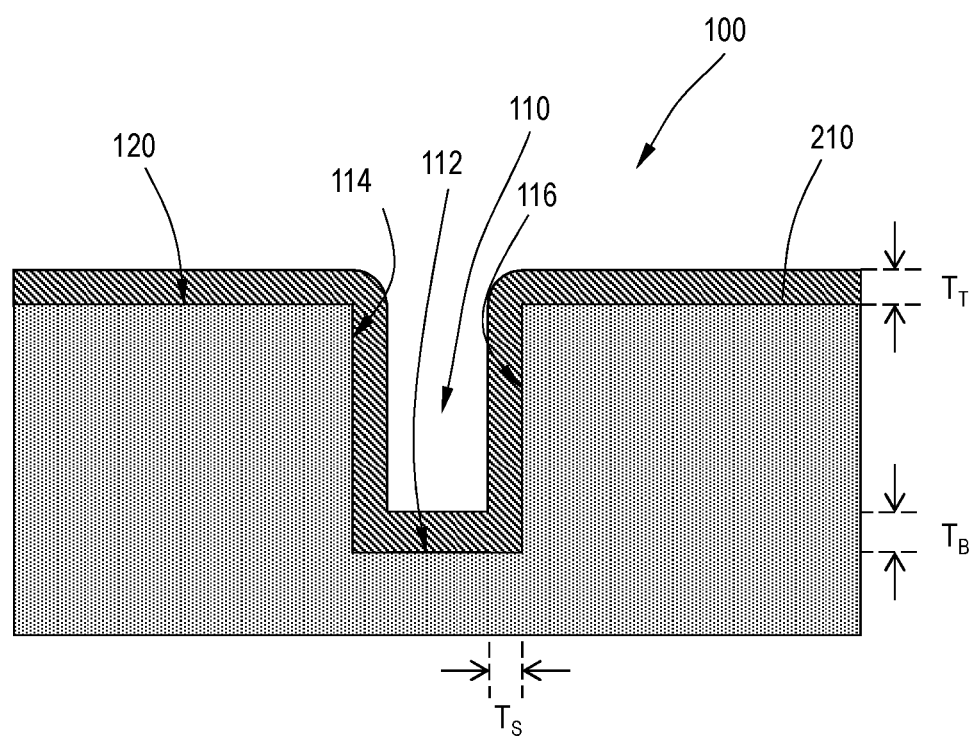
FIG. 3 illustrates an exemplary substrate with a wide CD after processing according to one or more embodiment of the disclosure.
Figure 4:
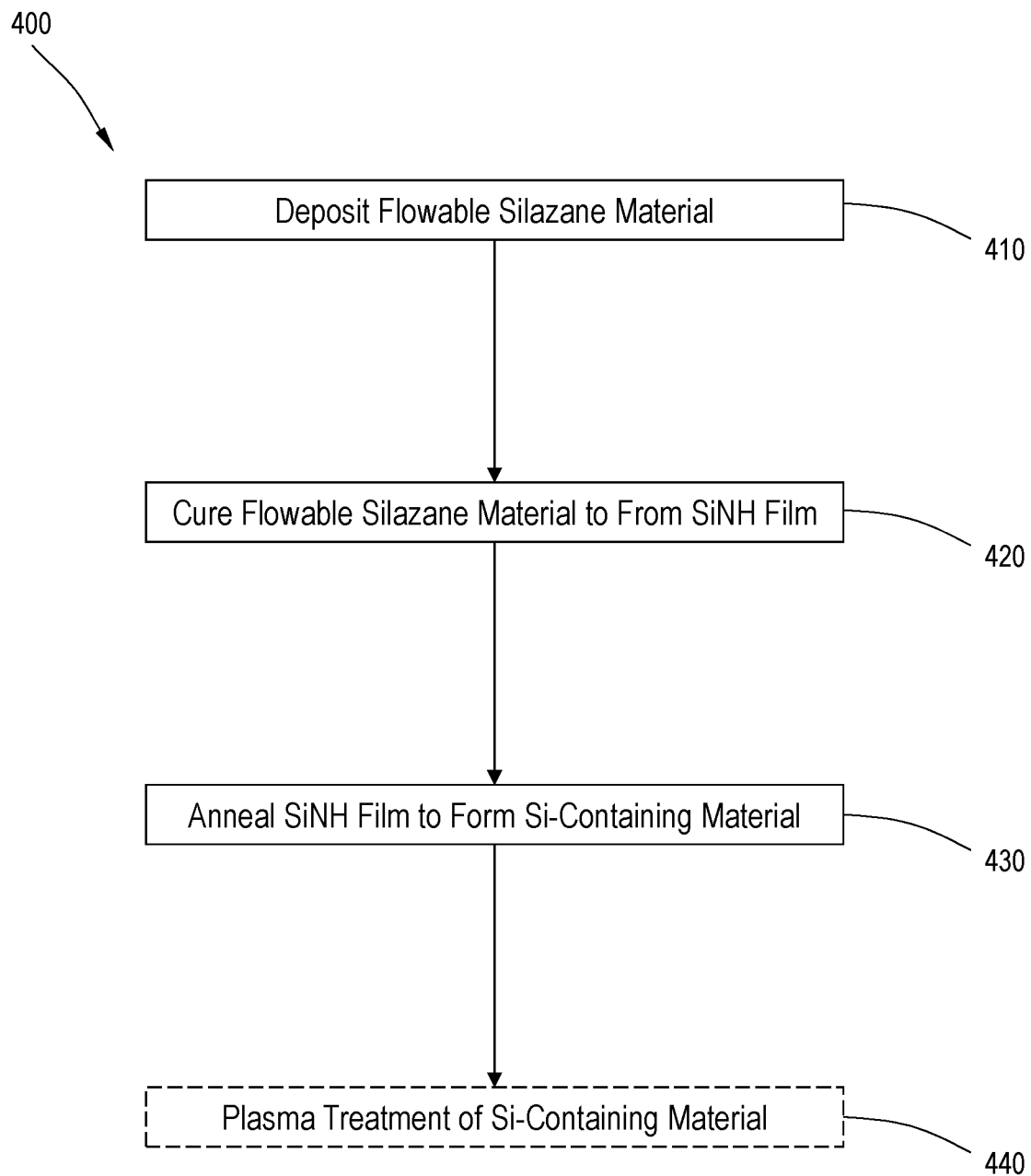
FIG. 4 illustrates an exemplary processing method according to one or more embodiment of the disclosure.

Referring to FIG. 3, in some embodiments, the at least one feature has a wider opening width (in a range of 20 nm to 40 nm) and the silicon-containing material forms conformally on the surface of the at least one feature 110. As used in this regard, a material which is conformal on a surface has an average thickness $T_s$ on the sidewalls, a thickness $T_B$ on the bottom and a thickness $T_T$ on the top surfaces which are within a range of ±10%, within a range of ±5%, or within a range of ±2%. As mentioned previously, it is possible to control the relative flow rate of the flowable polysilazane material. Accordingly, even though the material is flowable, it is possible to perform the cure and anneal processes discussed below before the material has the opportunity to flow off the top and sidewall surfaces. This is particularly true when there is little to no capillary force pulling the flowable silazane material into the feature 110.

The method 400 continues at operation 420 by exposing the flowable polysilazane material to UV radiation to cure the flowable polysilazane material 210 and form a SiNH film 220. In some embodiments, the substrate surface is optionally exposed to a cure reactant before or simultaneous to exposing the flowable polysilazane material 210 to the UV radiation.

In some embodiments, the cure reactant is determinative of the final composition of the silicon-containing material 240. In some embodiments, the silicon-containing material 240 comprises silicon oxide and the cure reactant comprises oxygen ($O_2$) or ozone ($O_3$). In some embodiments, the silicon-containing material comprises silicon nitride and the cure reactant comprises ammonia ($NH_3$). In this regard, the SiNH film 220 of some embodiments may also be described as an SiNOH film. For the purposes of this disclosure the term "SiNH film 220" is intended to refer to an SiNH film or an SiNOH film.

At operation 430, the SiNH film 220 is annealed in an anneal environment to form a silicon-containing material 240. In some embodiments, the anneal environment comprises an increased temperature relative to the process temperature used for operation 410 or operation 420. In some embodiments, the temperature of the anneal environment is in a range of 300° C. to 700° C., in a range of 300° C. to 500° C., in a range of 500° C. to 700° C., in a range of 300° C. to 400° C., in a range of 400° C. to 500° C., in a range of 500° C. to 600° C., or in a range of 600° C. to 700° C. In some embodiments, the anneal environment comprises water or steam.

In some embodiments, operation 410 and operation 420 are repeated to form a predetermined thickness of the SiNH film 220 before continuing to operation 430. This process may be referred to as a dep-cure cycles followed by an anneal step. In some embodiments, operation 410, operation 420 and operation 430 are repeated in sequence to form a predetermined thickness of a silicon-containing material 240. This process may be referred to as a dep-cure-anneal cycle.

In some embodiments, at operation 440 the silicon-containing material 240 is optionally exposed to a plasma treatment to improve one or more film properties. In some embodiments, the improved film property is a reduced wet etch rate or wet etch rate ratio relative to a thermally deposited $SiO_2$ film. In some embodiments, the plasma treatment comprises one or more of RF plasma, DC plasma or microwave plasma. In some embodiments, the plasma treatment is performed at a relatively low temperature. In some embodiments, the temperature during the plasma treatment is less than or equal to 700° C., less than or equal to 600° C. or less than or equal to 500° C. In some embodiments, the plasma treatment comprises a plasma formed from one or more inert gases, including but not limited to He, Ne, Ar or Xe. In some embodiments, the plasma treatment comprises a plasma formed from one or more reactive gases, including but not limited to $O_2$, $H_2$, $H_2O$, $H_2O_2$ or a combination of $H_2$ and $O_2$.

Figure 5:
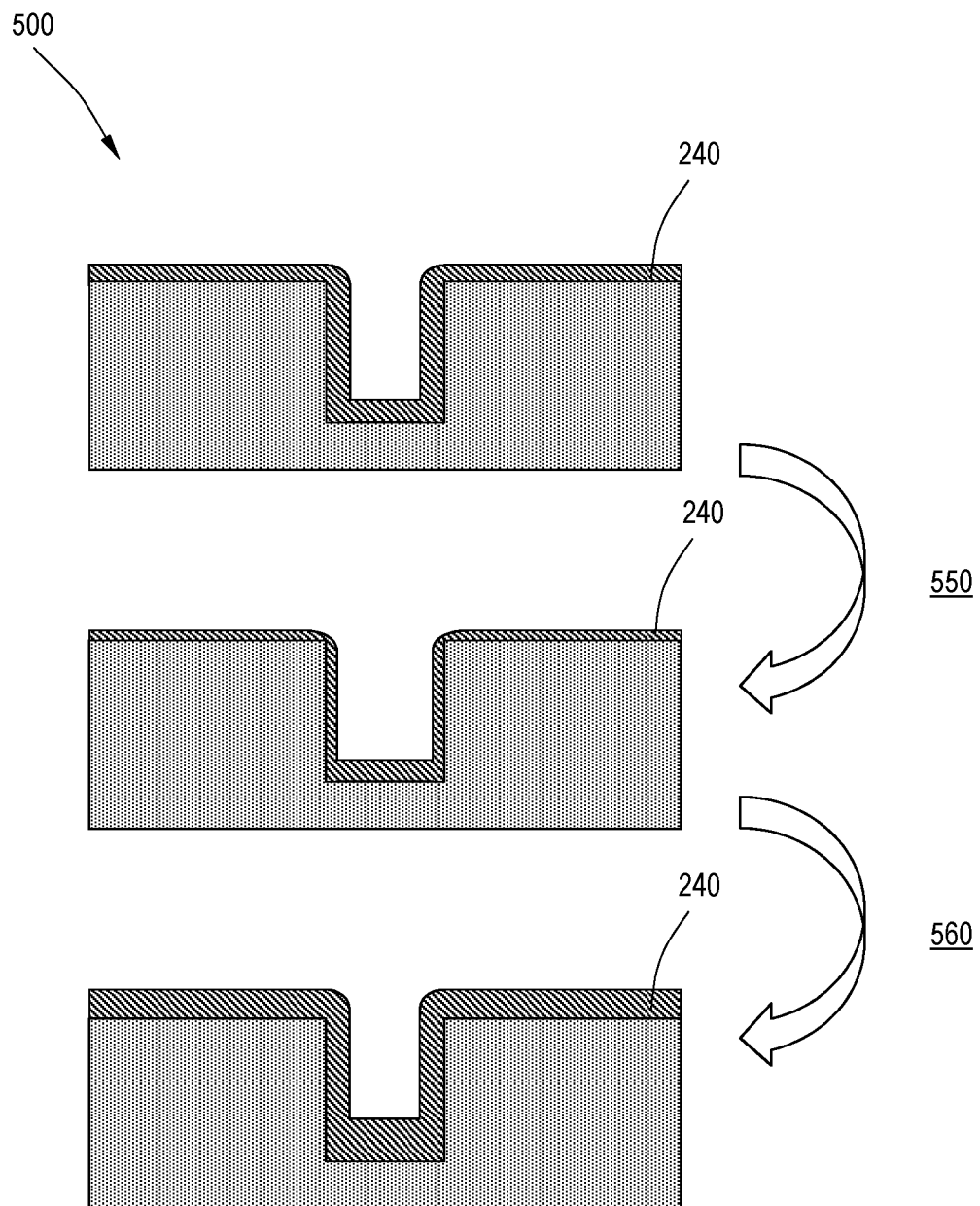
FIG. 5 illustrates an exemplary processing method for bottom-up fill according to one or more embodiment of the disclosure.

Referring to FIG. 5, in some embodiments, a method 500 for forming a silicon containing-material in a bottom-up fashion begins with previously disclosed method 400 to form the silicon-containing material 240. At operation 550, the silicon-containing material 240 is etched to remove the silicon-containing material 240 from the upper portion of the sidewall 114, 116 of the at least on feature 110. Next at operation 560, the method 400 and operation 550 are repeated to deposit additional silicon-containing material 240 and etch the silicon-containing material 240 to form the silicon-containing material in the at least one feature in a bottom-up fashion.

Similarly, in some embodiments, not shown, operation 550 may be inserted into method 400 and the resulting method repeated to form the silicon-containing material 240 in the at least one feature in a bottom-up fashion. For example, operation 550 may be performed on the flowable polysilazane material 210 before curing the flowable polysilazane material 210 at operation 420. Alternatively, operation 550 may be performed on the SiNH film 220 before annealing the SiNH film 220 at operation 430.

In some embodiments, the formation rate of the silicon-containing material 240 may be controlled. Without being bound by theory it is believed that a slower deposition rate leads to the relatively low flow rate of the flowable polysilazane material 210. This low flow rate is believed to enable both the conformal deposition for wider features and the seam/void free deposition in narrower features. In some embodiments, the deposition rate of the flowable polysilazane material 210 or the SiNH film 220 is less than or equal to 10 Å/sec, less than or equal to 8 Å/sec, or less than or equal to 5 Å/sec.

In some embodiments, the film properties of the silicon-containing material are superior to silicon-containing material deposited by other methods. For example, in some embodiments, the root mean squared roughness ($R_q$) of the silicon-containing material 240 is less than or equal to 0.3.

As mentioned previously several process parameters may be controlled in order to adjust the flow rate of the flowable polysilazane material. The impact of the formation rate of the flowable polysilzane material is discussed above.

Further, the temperature of the substrate may be controlled during the method of forming the silicon-containing material 240. In some embodiments, the substrate is maintained at a temperature in a range of 50° C. to 200° C., or in a range of 50° C. to 150° C., or in a range of 50° C. to 100° C., or in a range of 50° C. to 75° C., or in a range of 100° C. to 200° C., in a range of 150° C. to 200° C. or in a range of 60° C. to 150° C. Without being bound by theory, it is believed that relatively higher processing temperatures provide films with decreased roughness, decreased defects, slower flow rates and increased conformality on wider features.

Additionally, the pressure of the processing environment may be controlled during the method of forming the silicon-containing material. In some embodiments, the processing chamber is maintained at a pressure in a range of 1 mTorr to 100 Torr in a range of 10 mTorr to 10 Torr, in a range of 10 mTorr to 1.0 Torr, or in a range of 0.1 Torr to 1.0 Torr. Without being bound by theory, it is believed that relatively lower processing pressures provide films with decreased roughness, decreased defects, slower flow rates and increased conformality on wider features.

Figure 6:
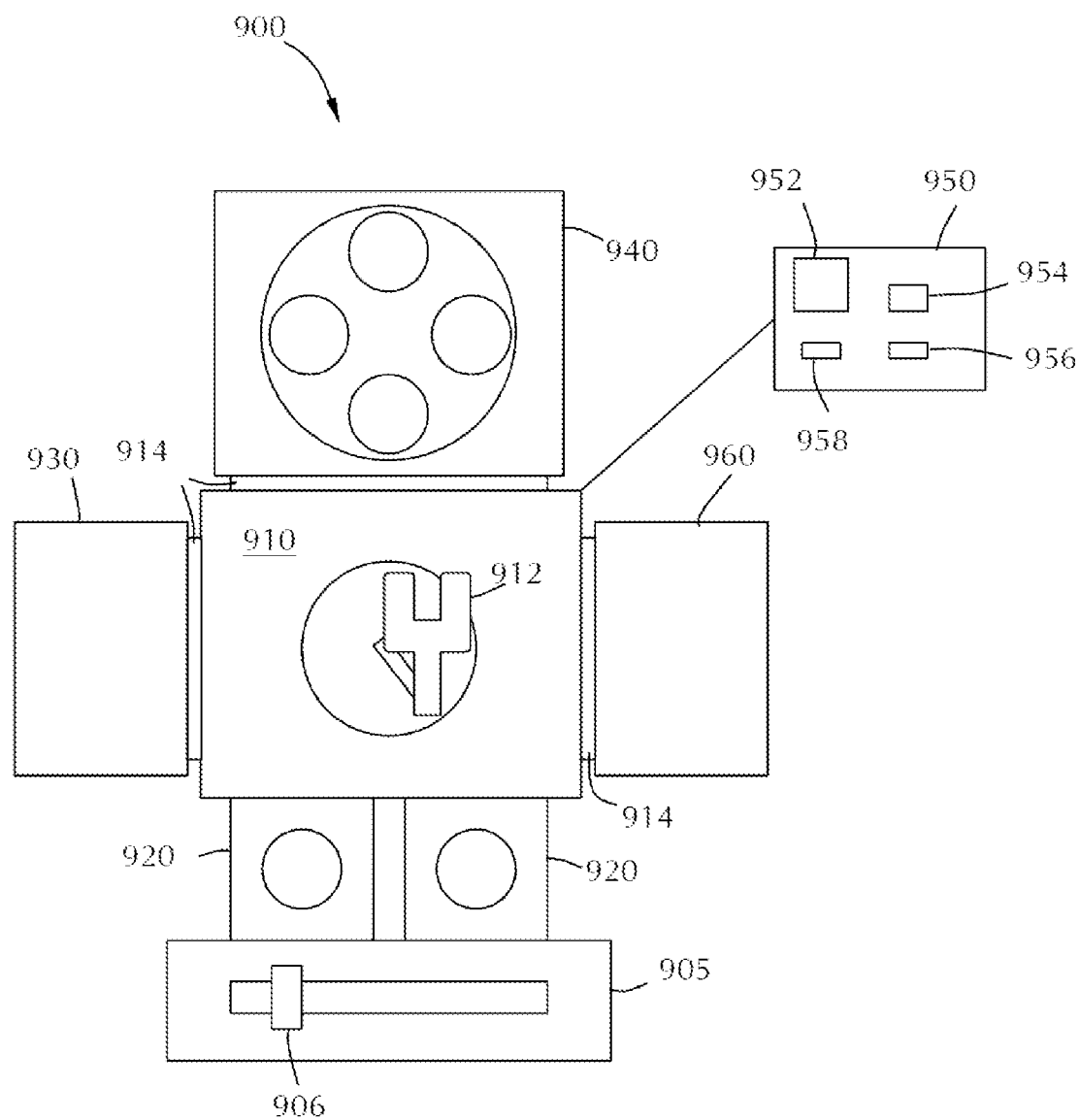
FIG. 6 illustrates an exemplary processing system according to one or more embodiment of the disclosure.

With reference to FIG. 6, additional embodiments of the disclosure are directed to a processing system 900 for executing the methods described herein. FIG. 6 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot;

however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 6, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a plasma deposition chamber and may be in fluid communication with one or more reactive gas sources to provide one or more flows of reactive gases to the first processing chamber 930. The substrate can be moved to and from the processing chamber 930 by the robot 912 passing through isolation valve 914.

Processing chamber 940 can also be connected to the central transfer station 910. In some embodiments, processing chamber 940 comprises a UV cure chamber and is fluid communication with one or more reactive gas sources to provide flows of reactive gas to the processing chamber 940 to perform the isotropic etch process. The substrate can be moved to and from the processing chamber 940 by robot 912 passing through isolation valve 914.

Processing chamber 945 can also be connected to the central transfer station 910. In some embodiments, the processing chamber 945 is the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as an anneal chamber. The processing chamber 960 can be configured to perform one or more different epitaxial growth processes.

In some embodiments, each of the processing chambers 930, 940, 945 and 960 are configured to perform different portions of the processing method. For example, processing chamber 930 may be configured to perform the plasma deposition process, processing chamber 940 may be configured to perform the UV cure process, processing chamber 960 may be configured to perform an anneal process. The skilled artisan will recognize that the number and arrangement of individual processing chamber on the tool can be varied and that the embodiment illustrated in FIG. 6 is merely representative of one possible configuration.

In some embodiments, the processing system 900 includes one or more metrology stations. For example metrology stations can be located within pre-clean/buffer chamber 920, within the central transfer station 910 or within any of the individual processing chambers. The metrology station can be any position within the system 900 that allows the distance of the recess to be measured without exposing the substrate to an oxidizing environment.

At least one controller 950 is coupled to one or more of the central transfer station 910, the pre-clean/buffer chamber 920, processing chambers 930, 940, 945, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and subprocessors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers and a metrology station; a configuration to load and/or unload substrates from the system; a configuration to deposit a flowable polysilazane material; a configuration to cure the flowable polysilazane material and form an SiNH film; a configuration to anneal the SiNH film and form a silicon-containing material.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method for depositing a silicon-containing material, the method comprising:
    exposing a substrate surface with at least one feature formed therein to a silicon precursor and a plasma based reactant to deposit a flowable polysilazane material;
    exposing the flowable polysilazane material to UV radiation to cure the flowable polysilazane material and form a SiNH film; and
    annealing the SiNH film in an anneal environment to form a silicon-containing material.

2. The method of claim 1, wherein the at least one feature has an opening width of less than or equal to 10 nm and the silicon-containing material laterally fills the at least one feature without substantial seam or void.

3. The method of claim 1, wherein the at least one feature has an opening width in a range of 20 nm to 40 nm and the silicon-containing material forms conformally on the surface of the at least one feature.

4. The method of claim 1, further comprising:
    etching the silicon-containing material to remove the silicon-containing material from an upper portion of a sidewall of the at least one feature; and
    repeatedly depositing additional silicon-containing material and etching the silicon-containing material from the upper portion of the sidewall to form the silicon-containing material in the at least one feature in a bottom-up fashion.

5. The method of claim 1, further comprising repeatedly depositing the flowable polysilazane material and curing the flowable polysilazane material to form a predetermined thickness of the SiNH film before annealing the SiNH film.

6. The method of claim 1, wherein the silicon-containing material is formed at a rate of less than or equal to 10 Å per second.

7. The method of claim 1, wherein the root mean squared roughness (Rq) of the silicon-containing material is less than or equal to 0.3.

8. The method of claim 1, wherein the substrate surface is maintained at a temperature in a range of 50° C. to 100° C.

9. The method of claim 1, wherein the silicon precursor consists essentially of trisilylamine (TSA).

10. The method of claim 1, wherein the plasma based reactant is ignited remotely.

11. The method of claim 1, wherein the plasma based reactant comprises a plasma reactant and an inert gas.

12. The method of claim 11, wherein the plasma reactant comprises one or more of ammonia ($NH_3$), oxygen ($O_2$) or water ($H_2O$).

13. The method of claim 11, wherein the inert gas comprises a noble gas (He, Ne, Ar, Xe).

14. The method of claim 1, further comprising exposing the substrate surface to a cure reactant before or simultaneous to exposing the flowable polysilazane material to UV radiation.

15. The method of claim 14, wherein the silicon-containing material comprises silicon oxide and the cure reactant comprises oxygen ($O_2$) or ozone ($O_3$).

16. The method of claim 14, wherein the silicon-containing material comprises silicon nitride and the cure reactant comprises ammonia ($NH_3$).

17. The method of claim 1, wherein the anneal environment comprises water.

18. The method of claim 1, further comprising exposing the silicon-containing material to a plasma treatment at a low temperature, the plasma treatment comprising one or more of RF plasma, DC plasma, or microwave plasma.

19. A method of forming a silicon oxide material, the method comprising:
    exposing a substrate surface with at least one feature formed therein to trisilylamine and a plasma based reactant comprising water and/or oxygen to deposit a flowable polysilazane material;
    exposing the flowable polysilazane material to UV radiation to cure the flowable polysilazane material and form a SiNH film, the substrate surface being exposed to oxygen or ozone before or during exposure to UV radiation; and
    annealing the SiNH film in an anneal environment comprising water to form a silicon oxide material, the silicon oxide material laterally filling the at least one feature without substantial seam or void when the opening width of the at least one feature is less than or equal to 10 nm and the silicon oxide material forming conformally on the surface of the at least one feature when the opening width of the at least one feature is in a range of 20 nm to 40 nm.

20. A method of forming a silicon oxide material, the method comprising:
    exposing a substrate surface with at least one feature formed therein to trisilylamine and a plasma based reactant comprising ammonia to deposit a flowable polysilazane material;
    exposing the flowable polysilazane material to UV radiation to cure the flowable polysilazane material and form a SiNH film, the substrate surface being exposed to ammonia before or during exposure to UV radiation; and
    annealing the SiNH film in a dry anneal environment to form a silicon nitride material, the silicon nitride material laterally filling the at least one feature without substantial seam or void when the opening width of the at least one feature is less than or equal to 10 nm and the silicon nitride material forming conformally on the surface of the at least one feature when the opening width of the at least one feature is in a range of 20 nm to 40 nm.

* * * * *